US011026343B1

(12) United States Patent
Telefus et al.

(10) Patent No.: US 11,026,343 B1
(45) Date of Patent: Jun. 1, 2021

(54) THERMODYNAMIC HEAT EXCHANGER

(71) Applicant: Flextronics AP, LLC, Broomfield, CO (US)

(72) Inventors: Mark Telefus, Orinda, CA (US); Hongwei Du, Singapore (SG); Rowell Gapuz, Quezon (PH); Kevin Cui, San Jose, CA (US); Bahman Sharifipour, Westford, MA (US); Laura Wen, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 14/310,733

(22) Filed: Jun. 20, 2014

Related U.S. Application Data

(60) Provisional application No. 61/837,489, filed on Jun. 20, 2013.

(51) Int. Cl.
*H05K 7/20* (2006.01)
(52) U.S. Cl.
CPC ....... *H05K 7/20127* (2013.01); *H05K 7/2039* (2013.01); *H05K 7/209* (2013.01)
(58) Field of Classification Search
CPC .............. H05K 7/209; H05K 7/20909; H05K 7/20918; H05K 7/20127; H05K 7/2039; H05K 7/20545
USPC ...... 165/80.2, 80.3, 185; 361/690, 692, 694, 361/704, 707, 709, 710, 714, 720
See application file for complete search history.

(56) References Cited

U.S. PATENT DOCUMENTS

| 3,568,762 A |   | 3/1971 | Harbaugh |
|---|---|---|---|
| 3,965,970 A |   | 6/1976 | Chisholm |
| 4,494,595 A |   | 1/1985 | Schmid |
| 4,535,386 A | * | 8/1985 | Frey, Jr. ................. H05K 7/206 165/104.33 |
| 4,974,667 A |   | 12/1990 | Sun |
| 5,089,935 A | * | 2/1992 | Ito .......................... H05K 7/209 361/692 |
| 5,162,974 A |   | 11/1992 | Currie |

(Continued)

OTHER PUBLICATIONS

Final Office Action dated Feb. 23, 2017, U.S. Appl. No. 14/482,954, filed Sep. 10, 2014, applicant: Jordon Musser, 23 pages.
(Continued)

*Primary Examiner* — Eric S Ruppert
*Assistant Examiner* — Hans R Weiland
(74) *Attorney, Agent, or Firm* — Haverstock & Owens LLP

(57) ABSTRACT

A thermodynamic heat exchanger is an electronic device having one or more heat generating devices, a heat exchanging element, and one or more heat exhaust elements. The heat generating devices can be the active and passive electronics elements included within a power conversion circuit, such as a power adapter used to charge a cellular telephone or other type of consumer electronics device. The heat exchanging element is configured to accept radiated thermal energy from the heat generating devices and distribute the accepted thermal energy across an outer surface to evenly distribute hot spots corresponding to the individual heat generating devices. The heat exchanging element is also configured to minimize heat radiating from its outer surface, thereby blocking heat in the thickness of the thermally conductive material.

19 Claims, 3 Drawing Sheets

(56) References Cited

U.S. PATENT DOCUMENTS

| | | | |
|---|---|---|---|
| 5,195,575 A | 3/1993 | Wylie | |
| 5,216,580 A | 6/1993 | Davidson | |
| 5,258,888 A * | 11/1993 | Korinsky | H05K 7/209 361/690 |
| 5,346,000 A | 9/1994 | Schlitt | |
| 5,360,058 A | 11/1994 | Koeppel | |
| 5,777,846 A * | 7/1998 | Hayes | H05K 7/20545 361/690 |
| 5,831,830 A * | 11/1998 | Mahler | H01Q 1/02 165/185 |
| 6,104,602 A * | 8/2000 | Morris | H05K 7/20127 165/185 |
| 6,201,705 B1 * | 3/2001 | Nygren | H05K 7/20563 165/80.3 |
| 6,237,223 B1 | 5/2001 | McCullough | |
| 6,410,982 B1 | 6/2002 | Brownell | |
| 6,490,160 B2 | 12/2002 | Dibene, II | |
| 6,571,863 B1 | 6/2003 | Liu | |
| 6,820,684 B1 | 11/2004 | Chu | |
| 6,910,794 B2 | 6/2005 | Rice | |
| 7,417,861 B2 * | 8/2008 | Kikuchi | H05K 7/209 257/E23.105 |
| 7,457,133 B2 * | 11/2008 | Chiang | H05K 7/20127 361/790 |
| 7,543,960 B2 | 6/2009 | Chang | |
| 7,746,639 B2 * | 6/2010 | Bopp | H05K 7/20154 165/80.3 |
| 7,857,037 B2 | 12/2010 | Parish | |
| 7,946,737 B2 | 5/2011 | Liu | |
| 8,035,964 B2 * | 10/2011 | Biagini | H05K 7/20918 165/185 |
| 8,235,562 B2 | 8/2012 | Chen | |
| 8,295,049 B2 * | 10/2012 | West | H05K 7/209 136/206 |
| 8,397,798 B2 | 3/2013 | Kroliczek | |
| 8,562,178 B2 | 10/2013 | Yang | |
| 8,723,205 B2 | 5/2014 | Ramer | |
| 8,759,843 B2 | 6/2014 | Ramer | |
| 9,146,059 B2 | 9/2015 | Hoang | |
| 9,255,743 B2 | 2/2016 | Lee | |
| 9,366,394 B2 | 6/2016 | Musser | |
| 9,436,235 B2 | 9/2016 | Damaraju | |
| 2002/0118511 A1 | 8/2002 | Dujari | |
| 2002/0144802 A1 | 10/2002 | Jairazbhoy | |
| 2004/0108104 A1 | 6/2004 | Luo | |
| 2005/0028965 A1 | 2/2005 | Chen | |
| 2005/0173098 A1 | 8/2005 | Connors | |
| 2006/0039111 A1 | 2/2006 | Huang | |
| 2006/0196640 A1 | 9/2006 | Siu | |
| 2006/0236718 A1 | 10/2006 | Lundberg | |
| 2006/0243428 A1 | 11/2006 | Sakayori | |
| 2007/0095506 A1 | 5/2007 | Hou | |
| 2007/0204975 A1 | 9/2007 | Liu | |
| 2008/0007954 A1 | 1/2008 | Li | |
| 2008/0170368 A1 | 7/2008 | Chen | |
| 2009/0071637 A1 | 3/2009 | Liao | |
| 2010/0038660 A1 | 2/2010 | Shuja | |
| 2011/0048676 A1 | 3/2011 | Toyoda | |
| 2013/0049018 A1 | 2/2013 | Ramer | |
| 2013/0049040 A1 | 2/2013 | Ramer | |
| 2013/0140011 A1 | 6/2013 | Kroliczek | |
| 2013/0199770 A1 | 8/2013 | Cherian | |
| 2013/0284395 A1 | 10/2013 | Kamoshida | |
| 2014/0138059 A1 | 5/2014 | Ambrose | |
| 2014/0150995 A1 | 6/2014 | Dai | |
| 2014/0190667 A1 | 7/2014 | McGlen | |
| 2015/0027679 A1 | 1/2015 | Singh | |
| 2015/0305199 A1 | 10/2015 | Yu | |
| 2016/0227672 A1 | 8/2016 | Lin | |
| 2016/0341486 A1 | 11/2016 | Kim | |

OTHER PUBLICATIONS

Non-final office action dated Jun. 14, 2017, U.S. Appl. No. 14/482,954, filed Sep. 10, 2014, applicant: Jordon Musser, dated Jun. 14, 2017, 22 pages.

* cited by examiner

THERMODYNAMIC HEAT EXCHANGER

RELATED APPLICATIONS

This Patent Application claims priority under 35 U.S.C. 119 (e) of the U.S. Provisional Application, Ser. No. 61/837,489, filed Jun. 20, 2013, and entitled "THERMODYNAMIC HEAT EXCHANGER". This application incorporates U.S. Provisional Application, Ser. No. 61/837,489 in its entirety by reference.

FIELD OF THE INVENTION

The present invention relates to the field of heat exchangers. More particularly, the present invention relates to the thermodynamic heat exchanger used for example, the cool a power converter.

BACKGROUND

Many electronics circuits depend on reliable heat dissipation systems to ensure stable operation and efficiency. Thermal excitement in electrical systems leads to increased noise. Without an effective heat dissipation system, failure or unstable operation is possible.

Conventional heat dissipation systems depend on one or more of the following strategies: passive convection operating directly on the heat producing components of the electronic device; addition of an active cooling solution, such as a fan or liquid cooling system; placement of a heat sink in conductive contact with the heat producing components, such that the heat sink and the components are then in thermal equilibrium and both dissipate heat through convective means.

To offer higher capacity heat transfer, new heat dissipation equipment must be more efficient. It is difficult for air-cooled heat sinks to grow in size, because equipment manufacturers are under tremendous competitive pressure to maintain or diminish the size of their equipment packages, all the while filling them with more and more components. In addition, larger heat sinks typically will increase the cost of the heat sink element. Thus, competitive heat dissipation equipment must be relatively compact in size and must perform at levels sufficient to prevent high-performance components from exceeding their operational heat specifications. Conventional heat dissipation systems are at odds with these requirements. Heat sinks and active cooling solutions are bulky and require additional space within the device package.

Traditional AC/DC power converters, such as for cellular telephones, typically include a plastic housing with air or other insulation surrounding the electronic power convertor circuit. For cooling, such circuits have relied on large device packages and, in some cases, the presence of vents to facilitate passive convective cooling of an enclosed circuit board including a plurality of electronic components mounted on a PCB. This strategy results in a device inconveniently large in size. Furthermore, the convective means of cooling circuitry in an enclosed space, even with vent holes, has poor efficiency, resulting in a high equilibrium operating temperature for the electronic device.

SUMMARY OF THE INVENTION

A thermodynamic heat exchanger is an electronic device having one or more heat generating devices, a heat exchanging element, and one or more heat exhaust elements. The heat generating devices can be the active and passive electronics elements included within a power conversion circuit, such as a power adapter used to charge a cellular telephone or other type of consumer electronics device. The heat exchanging element is configured to accept radiated thermal energy from the heat generating devices and distribute the accepted thermal energy across an outer surface to evenly distribute hot spots corresponding to the individual heat generating devices. The heat exchanging element is also configured to minimize heat radiating from its outer surface, thereby blocking heat in the thickness of the thermally conductive material.

In an aspect, a thermodynamic heat exchanger one or more heat generating devices, one or more heat exhaust elements, wherein each of the one or more heat exhaust elements is electrically coupled to the one or more heat generating devices, and a heat exchanging element thermally coupled to the one or more heat generating devices and thermally coupled to the one or more exhaust elements. The heat exchanging element encloses the one or more heat generating devices except for one or more openings in the heat exchanging element through each of which passes a corresponding one of the one or more exhaust elements. The heat exchanging element is separated from the one or more heat exhaust elements by an air gap. The heat exchanging element is configured to receive thermal energy radiated from the one or more heat generating devices and to pass the received thermal energy to an outer surface. The heat exchanging element has a thickness sufficient so that the heat exchanging element functions as a heat blocker and enables natural convection at the outer surface to establish a heated air flow along the outer surface.

In some embodiments, the one or more heat generating devices are part of a power conversion circuit configured to receive power from one of the one more heat exhaust elements. In some embodiments, the heat exchanging element is thermally coupled to the one or more heat exhaust elements via natural convection. In some embodiments, the thermodynamic heat exchanger also includes an outer housing enclosing the heat exchanging element except for one or more openings in the outer housing through each of which passes a corresponding one of the one or more exhaust elements. In some embodiments, outer housing is separated from the heat exchanging element by an air gap. In some embodiments, a gap is present between an edge of each opening in the outer housing and the corresponding one of the one or more heat exhaust elements passing through the opening. In some embodiments, one of the one or more heat exhaust elements is an AC plug configured to plug into an AC wall socket. In some embodiments, one of the one or more heat exhaust elements is a power cord. In some embodiments, one of the one or more heat exhaust elements is a port. In some embodiments, heated air flow is output through the one or more openings in the heat exchanging element. In some embodiments, the heated air flow distributes heat across the entire outer surface of the heat exchanging element. In some embodiments, a gap is present between an edge of each opening in the heat exchanging element and the corresponding one of the one or more heat exhaust elements passing through the opening.

In another aspect, a method of cooling one or more heat generating devices is disclosed. The method includes electrically coupling one or more heat exhaust elements to the one or more heat generating devices, and thermally coupling a heat exchanging element to the one or more heat generating devices and to the one or more exhaust elements. The method also includes enclosing the one or more heat generating devices with the heat exchanging element except for one or more openings in the heat exchanging element through each of which passes a corresponding one of the one or more exhaust elements. The heat exchanging element is separated from the one or more heat exhaust elements by an air gap. The heat exchanging element is configured to receive thermal energy radiated from the one or more heat generating devices and to pass the received thermal energy to an outer surface. The heat exchanging element has a thickness sufficient so that the heat exchanging element functions as a heat blocker and enables natural convection at the outer surface to establish a heated air flow along the outer surface.

In some embodiments, the heat exchanging element is thermally coupled to the one or more heat exhaust elements via natural convection. In some embodiments, the method also includes enclosing the heat exchanging element with an outer housing except for one or more openings in the outer housing through each of which passes a corresponding one of the one or more exhaust elements. In some embodiments, enclosing the heat exchanging element includes separating the outer housing from the heat exchanging element by an air gap. In some embodiments, enclosing the heat exchanging element includes forming a gap between an edge of each opening in the outer housing and the corresponding one of the one or more heat exhaust elements passing through the opening. In some embodiments, heated air flow is output through the one or more openings in the heat exchanging element. In some embodiments, the heated air flow distributes heat across the entire outer surface of the heat exchanging element. In some embodiments, enclosing the heat generating devices includes forming a gap between an edge of each opening in the heat exchanging element and the corresponding one of the one or more heat exhaust elements passing through the opening.

Other features of the present invention will become apparent from consideration of the following description taken in conjunction with the accompanying drawings.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION

Figure 1:
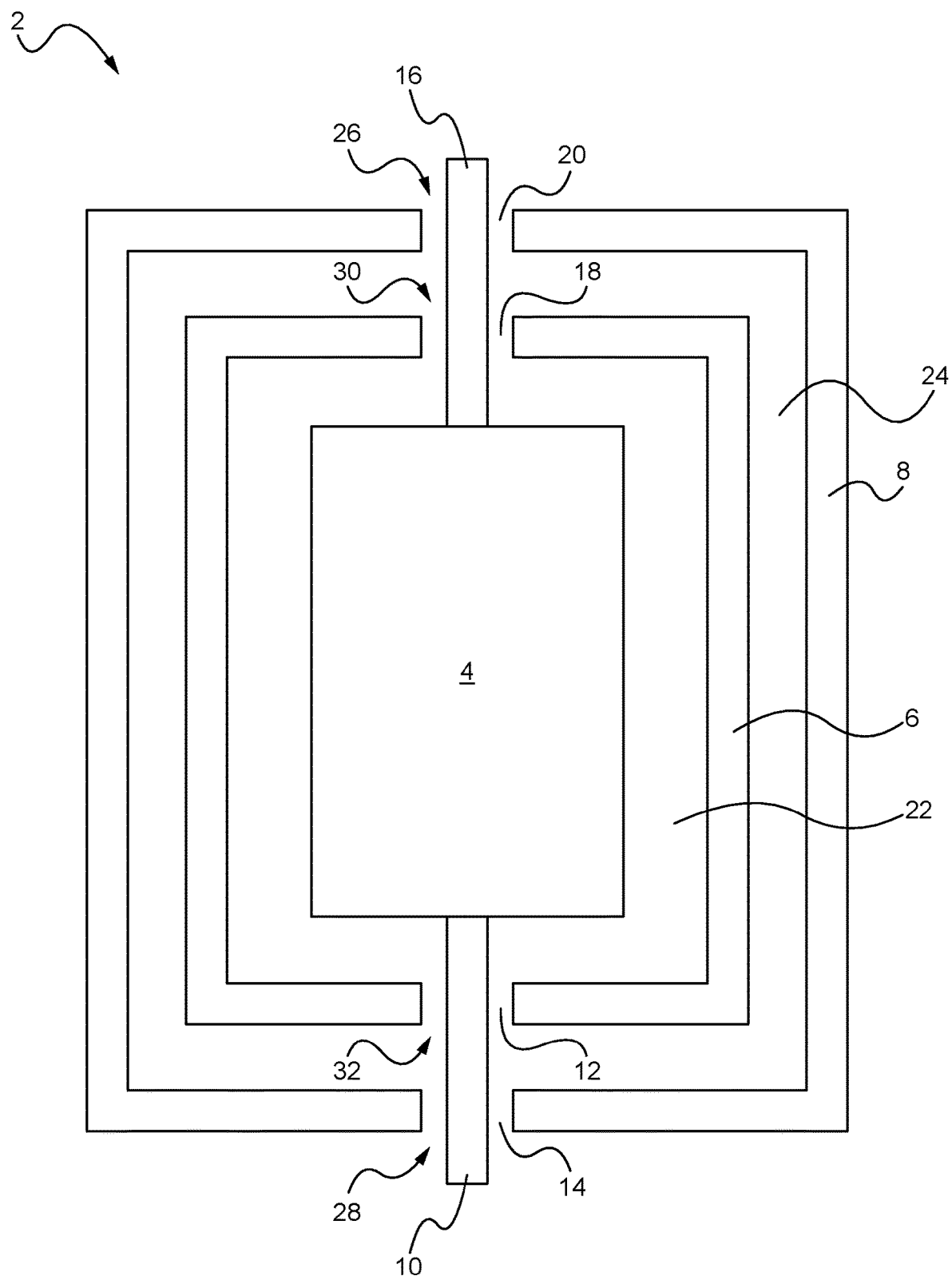
FIG. 1 illustrates a cut-out side view of a conceptual block diagram of a thermodynamic heat exchanger according to an embodiment.

Embodiments of the present application are directed to a thermodynamic heat exchanger. Those of ordinary skill in the art will realize that the following detailed description of the thermodynamic heat exchanger is illustrative only and is not intended to be in any way limiting. Other embodiments of the thermodynamic heat exchanger will readily suggest themselves to such skilled persons having the benefit of this disclosure.

Reference will now be made in detail to implementations of the thermodynamic heat exchanger as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of the thermodynamic heat exchanger are directed to an electronic device having one or more heat generating devices, a heat exchanging element, and one or more heat exhaust elements. In some embodiments, the electronic device is configured to remove heat generated by a power conversion circuit where the heat generating devices are the active and passive electronics elements included within the power conversion circuit. Examples of such heat generating devices include, but are not limited to, transformers, capacitors, resistors, diodes and transistors. In some embodiments, the electronic device is a power adapter used to charge a cellular telephone or other type of consumer electronics device. In some embodiments, the power conversion circuit is coupled to receive electric power from a power supply network via power supply leads, such as AC plugs. It is understood that the electronic device can be other than a power adapter.

For illustration purposes only, and by way of example, the thermodynamic heat exchanger is shown to be employed for a power converter, in particular an AC/DC converter. As will be seen below, the thermodynamic heat exchanger can be easily employed in the fabrication of other electronic devices, such as, and without limitation, power amplifiers and computing devices. The thermodynamic heat exchanger will be described in detail below in the context of an application for an AC/DC converter; however, such disclosure is not intended to limit the scope of the present invention to such an application.

The heat exchanging element is a thermally conductive material configured to a have at least two characteristics. First, the heat exchanging element is configured to accept radiated thermal energy from the heat generating devices and distribute the accepted thermal energy across an outer surface to evenly distribute hot spots corresponding to the individual heat generating devices. Second, the heat exchanging element is configured to minimize heat radiating from its outer surface, thereby blocking heat in the thickness of the thermally conductive material.

A heat exhaust element extends inside a device outer housing and is electrically coupled to the device electronics, such as the power conversion circuit. The device electronics are hereafter referred to as a power conversion circuit although application to alternative device electronics is contemplated. The heat exhaust element also extends outside the device outer housing to provide external electrical connection. In some embodiments, the heat exhaust element is a power supply lead, such as the AC plug, or a power cord that terminates in a DC power coupling. In addition to providing external electrical connectivity to the internal power conversion circuit, the heat exhaust element provides a heat relief channel from the internal power conversion circuit.

The heat exchanging element is shaped and positioned so as to completely enclose the power conversion circuit except for openings through which the one or more heat exhaust elements are positioned. In some embodiments, the heat exchanging element is made of an electrically conductive metal, such as copper or aluminum, and as such the heat exchanging element is not in physical contact with the power conversion circuit or the heat exhaust elements. The openings in the enclosure formed by the heat exchanging element are configured with a minimum gap between the edge of the opening and the heat exhaust element passing therethrough. As small a gap as possible functions to maximize the thermodynamic heat exchange, as described in detail below.

FIG. 1 illustrates a cut-out side view of a conceptual block diagram of a thermodynamic heat exchanger 2 according to an embodiment. The thermodynamic heat exchanger 2 includes one or more heat generating devices 4. In this exemplary application, the thermodynamic heat exchanger 2 is configured as a power conversion device, and the one or more heat generating devices are part of a power conversion circuit. The thermodynamic heat exchanger 2 includes a substantially rigid outer housing 8 from one end of which extends a heat exhaust element 10. In some embodiments, the outer housing 8 is made of plastic. It is understood that the outer housing 8 can me made of alternative thermally insulated or partially thermally insulated materials. In some embodiments, the heat exhaust element 10 includes two power supply leads that form a standard male AC plug. The power supply leads can both be the same size or have polarity such that one blade is wider. A third power supply lead can be used as a conventional ground terminal. From an opposite end of the substantially rigid outer housing 8 extends a heat exhaust element 16. In some embodiments, the heat exhaust element 16 is a power cord which terminates in a DC power coupling. In other embodiments, the heat exhaust element 16 is a port, such as a USB port, for receiving an adapter, such as a USB cable coupling. It is understood that other types of heat exhaust elements are contemplated for the heat exhaust elements 10 and/or 16.

The outer housing 8 includes an opening 26 through which the heat exhaust element 16 extends, and an opening 28 through which the heat exhaust element 10 extends. The openings in the outer housing are configured such that a gap remains between the edge of the opening and the heat exhaust element. Specifically, a gap 20 in the opening 26 remains between the outer housing 8 and the heat exhaust element 16, and a gap 14 in the opening 28 remains between the outer housing 8 and the heat exhaust element 10.

The thermodynamic heat exchanger 2 also includes a heat exchanging element 6 between the power conversion circuit 4 and the outer housing 8. The heat exchanging element 6 is made of a thermally conductive material. In some embodiments, the heat exchanging element 6 is made of copper or aluminum. The heat exchanging element 6 is configured to enclose the power conversion circuit 4 except for openings 30 and 32 through which the heat exhaust elements 16 and 10, respectively, pass through. The openings in the heat exchanging element are configured such that a gap remains between the edge of the opening and the heat exhaust element. Specifically, a gap 18 in the opening 30 remains between the outer heat exchanging element 6 and the heat exhaust element 16, and a gap 12 in the opening 32 remains between the heat exchanging element 6 and the heat exhaust element 10. The openings 30 and 32 in the heat exchanging element 6, and the openings 26 and 28 in the outer housing 8 can be circular, rectangular, or any other shape. Preferably, the shape of the openings is similar to the shape of the corresponding heat exhaust element passing therethrough. In some embodiments, the heat exhaust elements can be wrapped with electrically insulated tape to safeguard against electrical shorting between the heat exhaust element and the edge of the opening in the heat exchanging element.

The heat exchanging element 6 is configured such that a gap 22 remains between an inner surface of the heat exchanging element 6 and the outer surfaces of the power conversion circuit 4. The heat exchanging element 6 and the outer housing 8 are configured such that a gap 24 remains between an outer surface of the heat exchanging element 6 and an inner surface of the outer housing 8.

Although not shown in FIG. 1, it is understood that support features can be included to secure in place the power conversion circuit 4, the heat exchanging element 6, and the outer housing 8 relative to each other. An examples of such support structures can include, but is not limited to, a plurality of support column spaced in the air gaps between the outer housing 8 and the heat exchanging element 6, and between the heat exchanging element 6 and the power conversion circuit 4. The support structures are made of electrically insulated material, such as plastic. The support structure material are also be thermally insulated, or substantially thermally insulated.

Figure 2:
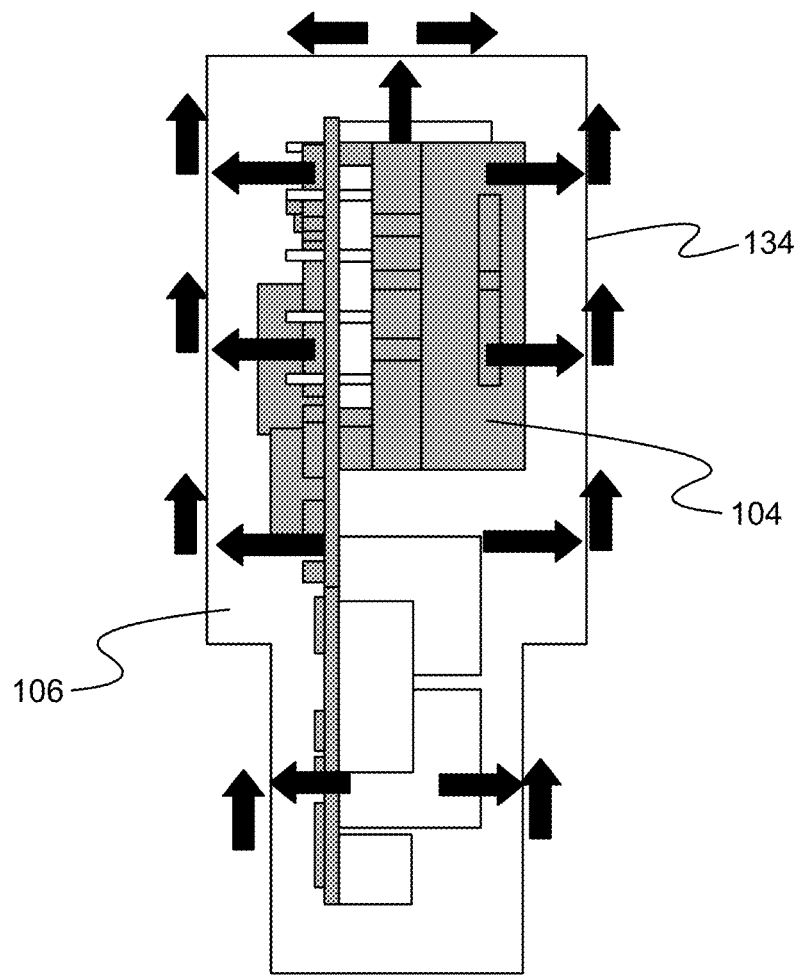
FIG. 2 illustrates an exemplary heat flow pattern within an exemplary thermodynamic heat exchanger according to an embodiment.

The heat exchanging element is configured so as to accept heat radiated from the heat generating devices of the power conversion circuit and to redistribute the accepted heat within the thermally conductive material. FIG. 2 illustrates an exemplary heat flow pattern within an exemplary thermodynamic heat exchanger according to an embodiment. The heat flow is indicated by the arrows. For simplicity, FIG. 2 only shows a power conversion circuit 104 and an outer surface 134 of a heat exchanging element 106. A thermal characteristic of the heat exchanging element 106 is that due to the temperature gradient between an inner surface facing the heat generating components of the power conversion circuit and an outer surface, heat impinging the inner surface of the heat exchanging element traverses a thickness of the heat exchanging element 106 to the outer surface. The heat exchanging element 106 is configured to be thick enough so that heat reaching the outer surface 134 has sufficient energy for natural convection but with minimal radiation off the outer surface. Such a condition results in heated air flow along the outer surface 134 of the heat exchanging element 104 due to natural convection.

Figure 3:
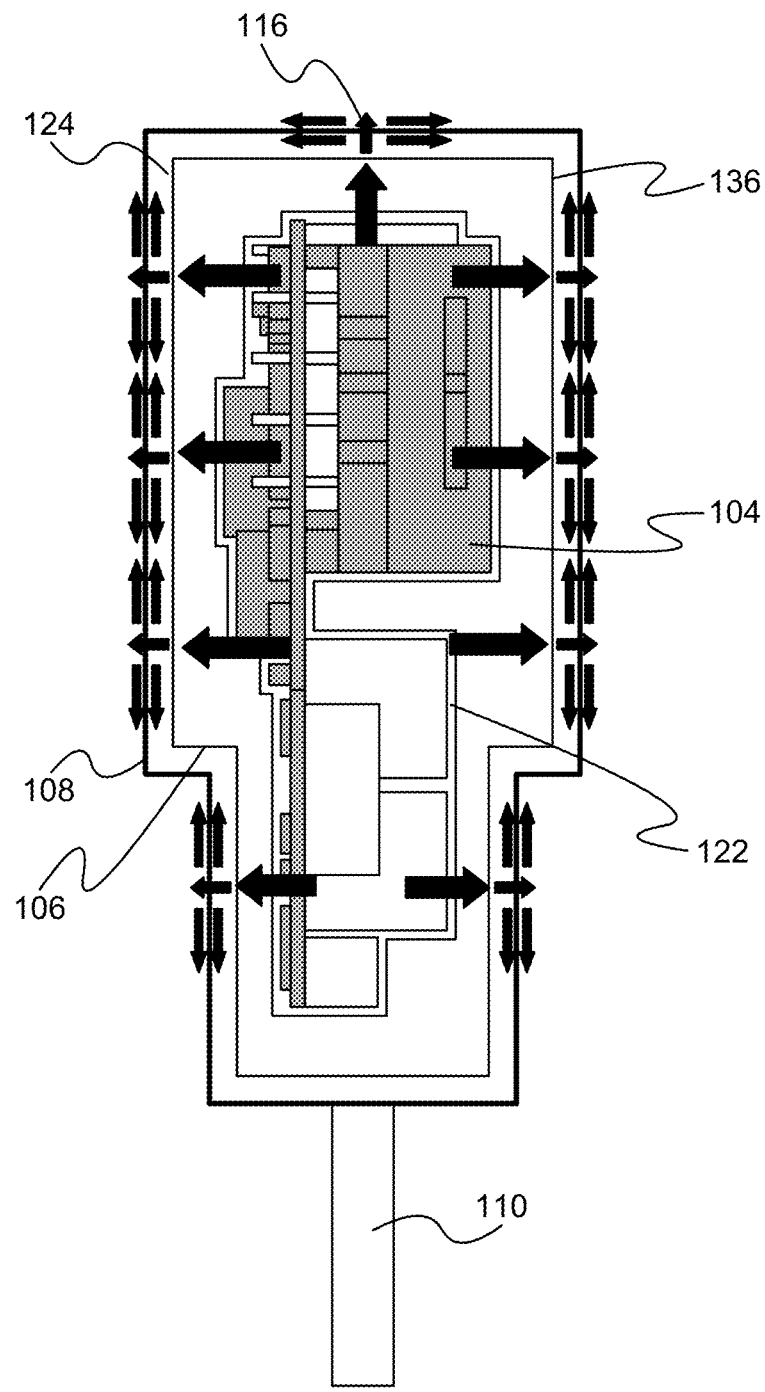
FIG. 3 illustrates the exemplary heat flow pattern within a more detailed version of the thermodynamic heat exchanger of FIG. 2.

FIG. 3 illustrates the exemplary heat flow pattern within a more detailed version of the thermodynamic heat exchanger of FIG. 2. As shown in FIG. 3, the heated air flow due to natural convection flows within an air gap 124 formed between the outer surface 134 of the heat exchanging element 106 and an inner surface 136 of an outer housing 106. The thermodynamic heat exchanger of FIG. 3 is an exemplary configuration of the thermodynamic heat exchanger 2 of FIG. 1, where the heat exchanging element 106 forms an enclosure around the power conversion circuit 104, separated by an air gap 122. Heat exhaust elements 110 and 116 are electrically coupled to the power conversion circuit 104. For simplicity, the openings in the heat exchanging element 106 and the outer housing 108, as well as the gaps between the heat exhaust elements 110 and 116 and the sides of the openings are not shown in FIG. 3.

The thickness of the heat exchanging element dictates a functional difference in the thermodynamic characteristics of the heat exchanging element. The amount of heat radiated off the heat exchanging element is regulated by selecting a specific thickness of the heat exchanging element. As used herein, the thickness is chosen so that the heat exchanging element functions as a heat blocker, meaning that heat accepted by the heat exchanging element from the power conversion circuit is substantially blocked, or minimized, from radiating off the outer surface of the heat exchanging element. It is understood, that the term "heat blocker" as used herein, is not intended to mean that 100% of the heat within the heat exchanging element is prevented from radiating off the outer surface. Instead, the term "heat blocker" is intended to differentiate the thermodynamic function of the heat exchanging element from a thermally conductive element where a substantial amount of heat is radiated off the outer surface. A heat exchanging element that is too thin will result in an undesirable amount of radiant heat which will disrupt the thermodynamic heat flow through and along the outer surface of the heat exchanging element, thereby minimizing the temperature cooling effects of the thermodynamic heat exchanger. The thickness of the heat exchanging element is application specific and will vary based on, for example, the type, size and configuration of the power conversion circuit, the number, size, and position of each heat generating component in the power conversion circuit, and the material used for the heat exchanging element. The application specific thickness of the heat exchanging element can be empirically determined.

As applied to the heat exchanging element used herein, the amount of heated air flow along the outer surface of the heat exchanging element due to natural convection is a function of the thickness of the heat exchanging element. As such, the thickness is great enough so that heat received on the inner surface of the heat exchanging element from the power conversion circuit penetrates or spreads through the thickness to the outer surface, but the radiating nature of the heat is sufficiently diminished so that the heat circulates across the outer surface of the heat exchanging element with minimal heat radiating off.

Referring again to FIG. 1, the gaps 12, 14 and 18, 20, as well as the heat exhaust elements 16 an 10 function as heat exhaust points for heat to output the thermodynamic heat exchanger 2. The openings 30 and 32 in the enclosure formed by the heat exchanging element 6 are configured with a minimum gap between the edge of the opening and the heat exhaust elements 16 and 10, respectively, passing therethrough. As small a gap as possible functions to maximize the heated air flow due to natural convection described above. In embodiments where the heat exchanging element 6 is made of an electrically conductive material, a minimum gap size is required to prevent electrical coupling between the heat exchanging element and the heat exhaust element. Similarly, the openings 26 and 28 in the outer housing 8 are configured with a minimum gap between the edge of the opening and the heat exhaust elements 16 and 10, respectively, passing therethrough. Heated air flow resulting from natural convection at the outer surface of the heat exchanging element is output through the openings in the heat exchanging element and the outer housing. Although a larger openings would result in larger area for the heated air flow to output, the openings are configured with as small a gap as possible. The smaller gaps function to maximize the heated air flow due to natural convection described above. Gaps that are too large disrupt the thermodynamic heat flow through and along the outer surface of the heat exchanging element, thereby reducing the natural convection and minimizing the overall temperature cooling effects of the thermodynamic heat exchanger. Additional heat can be output from the thermodynamic heat exchanger via the heat exhaust elements themselves. The electrical connections between the heat exhaust elements and the power conversion circuit also provide a physical path for thermal conduction.

The present application has been described in terms of specific embodiments incorporating details to facilitate the understanding of the principles of construction and operation of the thermodynamic heat exchanger. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A thermodynamic heat exchanger comprising:
   a. one or more heat generating devices;
   b. one or more heat exhaust elements, wherein each of the one or more heat exhaust elements is an electrical connector that is electrically coupled to the one or more heat generating devices, further wherein each of the one or more heat exhaust elements is physically attached to a side of one of the one or more heat generating devices;
   c. a heat exchanging element thermally coupled to the one or more heat generating devices, wherein the heat exchanging element encloses the one or more heat generating devices such that an entirety of each remaining side of the one or more heat generating devices that is not attached to any of the one or more heat exhaust elements is covered by the heat exchanging element as viewed from each of an axis extending perpendicularly from each respective remaining side and at least a portion of each side of the one or more heat generating devices that is attached to one of the one or more heat exhaust elements is covered by the heat exchanging element, while a remaining portion of each side of the one or more heat generating devices that is attached to one of the one or more heat exhaust elements is uncovered at one or more first openings in the heat exchanging element through each of which passes a corresponding one of the one or more heat exhaust elements, wherein the heat exchanging element includes no other openings other than the one or more first openings, further wherein the heat exchanging element is separated from the one or more heat generating devices by a first air gap, wherein the heat exchanging element is not in physical contact with the one or more heat generating devices, further wherein an edge of each first opening in the heat exchanging element is separated from the corresponding one or more heat exhaust elements by a second air gap, wherein the heat exchanging element is configured to receive thermal energy radiated from the one or more heat generating devices and to pass the received thermal energy to an outer surface, further wherein the heat exchanging element has a thickness sufficient so that the heat exchanging element enables natural convection at the outer surface to establish a heated air flow along the outer surface; and
   d. an outer housing enclosing the heat exchanging element except for one or more second openings in the outer housing through each of which passes a corresponding one of the one or more exhaust elements, wherein the outer housing includes no other openings other than the one or more second openings, further wherein a number of second openings in the outer housing is equal to a number of first openings in the heat exchanging element, and each one of the one or more second openings in the outer housing is aligned with a corresponding one of the one or more first openings in the heat exchanging element, wherein the outer housing is separated from the heat exchanging element by a third air gap.

2. The thermodynamic heat exchanger of claim 1 wherein the one or more heat generating devices comprise a power conversion circuit configured to receive power from one of the one more heat exhaust elements.

3. The thermodynamic heat exchanger of claim 1 wherein the heat exchanging element is thermally coupled to the one or more heat exhaust elements via natural convection.

4. The thermodynamic heat exchanger of claim 1 wherein a fourth gap is present between an edge of each second opening in the outer housing and the corresponding one of the one or more heat exhaust elements passing through the second opening, further wherein the heated air flowing along the outer surface of the heat exchanging element within the third air gap is output through the fourth air gap.

5. The thermodynamic heat exchanger of claim 1 wherein one of the one or more heat exhaust elements comprises an AC plug configured to plug into an AC wall socket.

6. The thermodynamic heat exchanger of claim 1 wherein one of the one or more heat exhaust elements comprises a power cord.

7. The thermodynamic heat exchanger of claim 1 wherein one of the one or more heat exhaust elements comprises a port.

8. The thermodynamic heat exchanger of claim 1 wherein the heated air flow distributes heat across the entire outer surface of the heat exchanging element.

9. The thermodynamic heat exchanger of claim 1 further comprising a plurality of thermally and electrically insulated support features positioned to secure in place the one or more heat generating devices, the heat exchanging element and the outer housing relative to each other.

10. The thermodynamic heat exchanger of claim 9 wherein the plurality of support features comprise a plurality of support columns spaced in the first air gap separating the heat exchanging element from the one or more heat generating devices and in the third air gap separating the outer housing from the heat exchanging element.

11. The thermodynamic heat exchanger of claim 1 wherein a contour of an inner surface of the outer housing matches a contour of an outer surface of the heat exchanging element.

12. The thermodynamic heat exchanger of claim 1 wherein the outer housing is not in physical contact with the heat exchanging element.

13. The thermodynamic heat exchanger of claim 1 wherein the one or more first openings of the heat exchanging element are formed in one or more sides of the heat exchanging element, further wherein the outer housing encloses the heat exchanging element such that an entirety of each remaining side of the heat exchanging element that does not include one of the first openings is covered by the outer housing and at least a portion of each side of the heat exchanging element that includes one of the first openings is covered by the outer housing, while a remaining portion of each side of the heat exchanging element that does include one of the first openings is uncovered at the one or more second openings in the outer cover through each of which passes a corresponding one of the one or more heat exhaust elements.

14. The thermodynamic heat exchanger of claim 1 wherein the thickness of the heat exchanging element is a function of the number, size, and position of each of the one or more heat generating devices within the thermodynamic heat exchanger.

15. A method of cooling one or more heat generating devices, the method comprising:
   a. electrically coupling one or more heat exhaust elements to the one or more heat generating devices, wherein each of the one or more heat exhaust elements is an electrical connector, further wherein each of the one or more heat exhaust elements is physically attached to a side of one of the one or more heat generating devices;
   b. thermally coupling a heat exchanging element to the one or more heat generating devices and to the one or more exhaust elements;
   c. enclosing the one or more heat generating devices with the heat exchanging element such that an entirety of each remaining side of the one or more heat generating devices that is not attached to any of the one or more heat exhaust elements is covered by the heat exchanging element as viewed from each of an axis extending perpendicularly from each respective remaining side and at least a portion of each side of the one or more heat generating devices that is attached to one of the one or more heat exhaust elements is covered by the heat exchanging element, while a remaining portion of each side of the one or more heat generating devices that is attached to one of the one or more heat exhaust elements is uncovered at one or more first openings in the heat exchanging element through each of which passes a corresponding one of the one or more heat exhaust elements, wherein the heat exchanging element includes no other openings other than the one or more first openings, further wherein the heat exchanging element is separated from the one or more heat generating devices by a first air gap, wherein the heat exchanging element is not in physical contact with the one or more heat generating devices, wherein an edge of each first opening in the heat exchanging element is separated from the corresponding one or more heat exhaust elements by a second air gap, further wherein the heat exchanging element is configured to receive thermal energy radiated from the one or more heat generating devices and to pass the received thermal energy to an outer surface, wherein the heat exchanging element has a thickness sufficient so that the heat exchanging element enables natural convection at the outer surface to establish a heated air flow along the outer surface; and
   d. enclosing the heat exchanging element with an outer housing except for one or more second openings in the outer housing through each of which passes a corresponding one of the one or more exhaust elements, wherein the outer housing includes no other openings other than the one or more second openings, further wherein a number of second openings in the outer housing is equal to a number of first openings in the heat exchanging element, and each one of the one or more second openings in the outer housing is aligned with a corresponding one of the one or more first openings in the heat exchanging element, wherein the outer housing is separated from the heat exchanging element by a third air gap.

16. The method of claim 15 wherein the heat exchanging element is thermally coupled to the one or more heat exhaust elements via natural convection.

17. The method of claim 15 wherein enclosing the heat exchanging element comprises forming a fourth gap between an edge of each second opening in the outer housing and the corresponding one of the one or more heat exhaust elements passing through the second opening, further wherein the heated air flowing along the outer surface of the heat exchanging element within the third air gap is output through the fourth air gap.

18. The method of claim 15 wherein the heated air flow distributes heat across the entire outer surface of the heat exchanging element.

19. The method of claim 15 further comprising securing in place the one or more heat generating devices, the heat exchanging element and the outer housing relative to each other using a plurality of thermally and electrically insulated support features.

* * * * *